(12) United States Patent
Kim et al.

(10) Patent No.: US 8,273,519 B2
(45) Date of Patent: Sep. 25, 2012

(54) HARDMASK COMPOSITION AND ASSOCIATED METHODS

(75) Inventors: Mi Young Kim, Suwon-si (KR); Sang Kyun Kim, Yongin-si (KR); Sang Hak Lim, Incheon-si (KR); Sang Ran Koh, Gunpo-si (KR); Hui Chan Yun, Ulsan-si (KR); Do Hyeon Kim, Gunpo-si (KR); Dong Seon Uh, Seoul (KR); Jong Seob Kim, Daejeon-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 1220 days.

(21) Appl. No.: 11/984,741

(22) Filed: Nov. 21, 2007

(65) Prior Publication Data

US 2008/0118875 A1    May 22, 2008

(30) Foreign Application Priority Data

Nov. 21, 2006  (KR) ................. 10-2006-0115411

(51) Int. Cl.
*G03F 7/075* (2006.01)
*G03F 7/038* (2006.01)
*G03F 7/20* (2006.01)
*G03F 7/30* (2006.01)
*G03F 7/36* (2006.01)

(52) U.S. Cl. .............. 430/270.1; 430/272.1; 430/311; 430/313; 430/317; 430/318; 430/323; 430/325; 430/326; 522/6; 522/31; 522/63; 522/65; 522/148; 522/172

(58) Field of Classification Search .................. None
See application file for complete search history.

(56) References Cited

U.S. PATENT DOCUMENTS

| | | | |
|---|---|---|---|
| 6,576,393 | B1 | 6/2003 | Sugita et al. |
| 7,115,531 | B2 | 10/2006 | Shaffer, II et al. |
| 7,163,778 | B2 | 1/2007 | Hatakeyama et al. |
| 7,659,357 | B2 | 2/2010 | Nakata et al. |
| 2004/0033444 | A1 | 2/2004 | Otoguro et al. |
| 2004/0247900 | A1 | 12/2004 | Ogihara et al. |
| 2005/0031791 | A1* | 2/2005 | Sasaki et al. ............. 427/372.2 |
| 2005/0042538 | A1 | 2/2005 | Babich et al. |

(Continued)

FOREIGN PATENT DOCUMENTS

| | | |
|---|---|---|
| CN | 1619415 A | 5/2005 |
| JP | 02-110464 A | 4/1990 |

(Continued)

OTHER PUBLICATIONS

JPO English abstract for JP2007-291167 (Nov. 2007).*

(Continued)

*Primary Examiner* — Sin J. Lee
(74) *Attorney, Agent, or Firm* — Lee & Morse, P.C.

(57) ABSTRACT

A hardmask composition includes a solvent and an organosilicon copolymer. The organosilicon copolymer may be represented by Formula A:

$$(SiO_{1.5}-Y-SiO_{1.5})_x(R^3SiO_{1.5})_y \qquad (A)$$

wherein x and y may satisfy the following relations: x is about 0.05 to about 0.9, y is about 0.05 to about 0.9, and x+y=1, $R^3$ may be a $C_1$-$C_{12}$ alkyl group, and Y may be a linking group including a substituted or unsubstituted, linear or branched $C_1$-$C_{20}$ alkyl group, a $C_1$-$C_{20}$ group containing a chain that includes an aromatic ring, a heterocyclic ring, a urea group or an isocyanurate group, or a $C_2$-$C_{20}$ group containing one or more multiple bonds.

10 Claims, 5 Drawing Sheets

| RESIST |
|---|
| MASK FOR PROCESSING UNDERLAYER FILM (HARDMASK FOR PROCESSING RESIST UNDERLAYER FILM) |
| UNDERLAYER FILM FOR PROCESSING OXIDE FILM |
| SILICON OXIDE FILM |

U.S. PATENT DOCUMENTS

| | | |
|---|---|---|
| 2005/0074689 A1 | 4/2005 | Angelopoulos et al. |
| 2007/0026689 A1* | 2/2007 | Nakata et al. .................. 438/781 |
| 2007/0057253 A1 | 3/2007 | Gronbeck et al. |
| 2008/0196626 A1* | 8/2008 | Wu et al. .................. 106/287.34 |

FOREIGN PATENT DOCUMENTS

| | | |
|---|---|---|
| JP | 2000-356854 A | 12/2000 |
| JP | 2004-059738 A | 2/2004 |
| JP | 2004-145262 A | 5/2004 |
| JP | 2005-070776 A | 3/2005 |
| JP | 2007-086773 A | 4/2007 |
| JP | 2007-291167 | * 11/2007 |
| TW | 200508792 | 3/2005 |
| TW | 200703481 | 1/2007 |

OTHER PUBLICATIONS

Machine-assisted English translation of JP2007-291167, provided by JPO (Nov. 2007).*

Xing, et al.; Synthesis and Application of Organoscilcon Products; Chemical Industrial Press; Sep. 2000; p. 334; People's Republic of China.

* cited by examiner

HARDMASK COMPOSITION AND ASSOCIATED METHODS

BACKGROUND OF THE INVENTION

1. Field of the Invention

Embodiments relate to a hardmask composition and associated methods. More particularly, embodiments relate to a hardmask composition for processing a resist underlayer film, a method of forming the hardmask composition, and a method of producing a device using the hardmask composition.

2. Description of the Related Art

An antireflective coating (ARC) material may be used to minimize reflectivity between a resist material layer and a substrate, in order to attain better resolution in a lithographic process. However, similarities in the composition of the ARC and the resist material layer may result in poor etch selectivity between the ARC material and the patterned resist layer. Accordingly, portions of the resist layer may be undesirably consumed during etching of the ARC after patterning.

Resist materials used in some lithographic techniques do not provide resistance to the subsequent etching step to an extent sufficient to effectively transfer a desired pattern to a layer underlying the resist material. For example, a resist pattern may be used as a mask to etch a substrate, e.g., a silicon oxide film, but miniaturization of circuits has resulted in a reduction of the thickness of resists, making it difficult for the resists to act as masks. As a result, etching of oxide films without any damage is difficult. Accordingly, a hardmask has been used to etch an underlying resist underlayer film, e.g., where an extremely thin resist material is used, a substrate to be etched is thick, a large etching depth is needed, and/or the use of a particular etchant is required. The hardmask plays a role as an intermediate layer between a patterned resist and a substrate to be patterned, and serves to transfer a pattern of the patterned resist to the substrate. Therefore, the hardmask should be able to withstand etching used to pattern the substrate.

A resist pattern may be transferred to an underlayer film for processing an oxide film, followed by dry etching the oxide film using the pattern-transferred underlayer film as a mask. The underlayer film for processing the oxide film may be a film that is formed under an antireflective film to function as an underlayer antireflective film. In this process, since the etch rate of the resist may be similar to that of the underlayer film, it may be necessary to form a mask between the resist and the underlayer film to etch the underlayer film. Specifically, an underlayer film for processing an oxide film, a mask for processing the underlayer film (i.e., a hardmask for processing the resist underlayer film) and a resist may be sequentially formed on an oxide film. Such a multilayer structure is shown in FIG. 1.

It is generally known that a structurally stable hardmask having a high silicon content exhibits improved etch resistance to an oxygen-based etching gas. A siloxane, e.g., a product of polycondensation of alkylsilyl and silyl hydride compounds, may be used to form a hardmask having an increased silicon content. However, typical silyl hydride compounds are sufficiently reactive to undergo uncontrollable condensation reactions, even in the presence of a small amount of water without the use of an additional catalyst. In addition, the highly reactive silane compounds tend to be gelled during condensation or purification. These disadvantages make it difficult to synthesize a polymer having required physical properties using such silane compounds. Also, due to poor stability of the polymer, it may be difficult to prepare a solution of the polymer that is stable during storage.

SUMMARY OF THE INVENTION

Embodiments are therefore directed to a hardmask composition and associated methods, which substantially overcome one or more of the problems due to the limitations and disadvantages of the related art.

It is therefore a feature of an embodiment to provide a hardmask composition including an organosilicon copolymer having a component that provides increased storage stability in combination with a component having a linking group, which may enhance etch resistance and increase hydrophilicity of the organosilicon copolymer.

It is therefore another feature of an embodiment to provide a hardmask composition including an organosilicon copolymer that also has a component that provides light absorption characteristics suitable to prevent reflections of UV light.

It is therefore another feature of an embodiment to provide a method of forming the hardmask composition.

It is therefore another feature of an embodiment to provide a method of producing a device using the hardmask composition.

At least one of the above and other features and advantages may be realized by providing a hardmask composition, including a solvent and an organosilicon copolymer. The organosilicon copolymer may be represented by Formula A:

$$(SiO_{1.5}-Y-SiO_{1.5})_x(R^3SiO_{1.5})_y \quad (A).$$

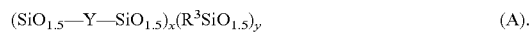

In Formula A, x and y may satisfy the following relations: x may be about 0.05 to about 0.9, y may be about 0.05 to about 0.9, and x+y may equal 1, $R^3$ may be a $C_1$-$C_{12}$ alkyl group, and Y may be a linking group including a substituted or unsubstituted, linear or branched $C_1$-$C_{20}$ alkyl group, a $C_1$-$C_{20}$ group containing a chain that includes an aromatic ring, a heterocyclic ring, a urea group or an isocyanurate group, or a $C_2$-$C_{20}$ group containing one or more multiple bonds.

The organosilicon copolymer may be represented by Formula B:

$$\{(SiO_{1.5}-Y-SiO_{1.5})_x(R^3SiO_{1.5})_y\}_n \quad (B).$$

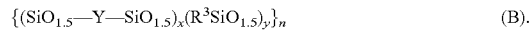

In Formula B, n may be from about 12 to about 2,000.

The portion $(SiO_{1.5}-Y-SiO_{1.5})$ in Formula A may be a derivative of a hydrolysate of a substituted or unsubstituted one of the following compounds:

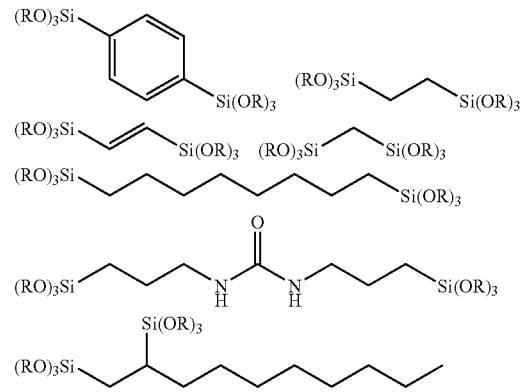

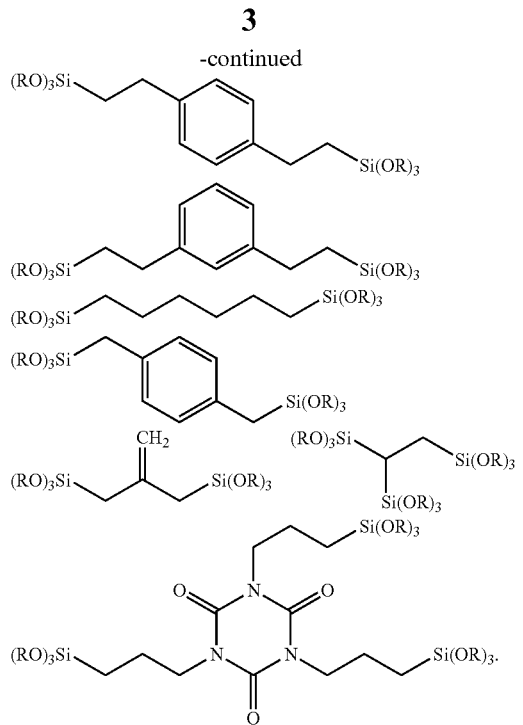

The organosilicon copolymer may further include a UV chromophore group X and may be represented by Formula C:

$$(SiO_{1.5}-Y-SiO_{1.5})_x(R_3SiO_{1.5})_y(XSiO_{1.5})_z \quad (C).$$

In Formula C, x, y and z may satisfy the following relations: x may be about 0.05 to about 0.9, y may be about 0.05 to about 0.9, z may be greater than 0 and less than about 0.9, and x+y+z may equal 1, and X may be a $C_6$-$C_{30}$ group containing at least one substituted or unsubstituted aromatic ring.

The organosilicon copolymer may be represented by Formula D:

$$\{(SiO_{1.5}-Y-SiO_{1.5})_x(R^3SiO_{1.5})_y(XSiO_{1.5})_z\}_n \quad (D).$$

In Formula D, n may be from about 12 to about 2,000.

The portion ($XSiO_{1.5}$) in Formula C may be a derivative of a hydrolysate of a substituted or unsubstituted one of the following compounds:

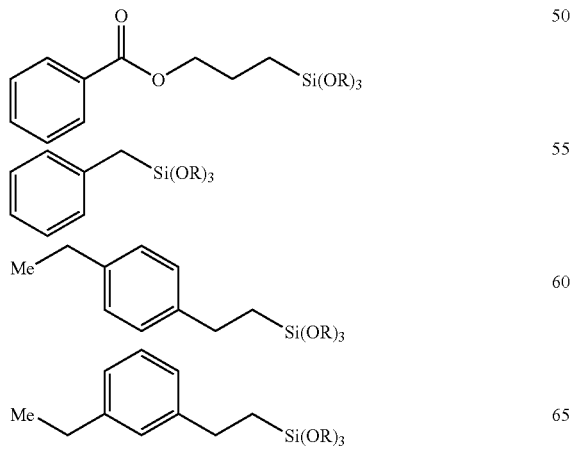

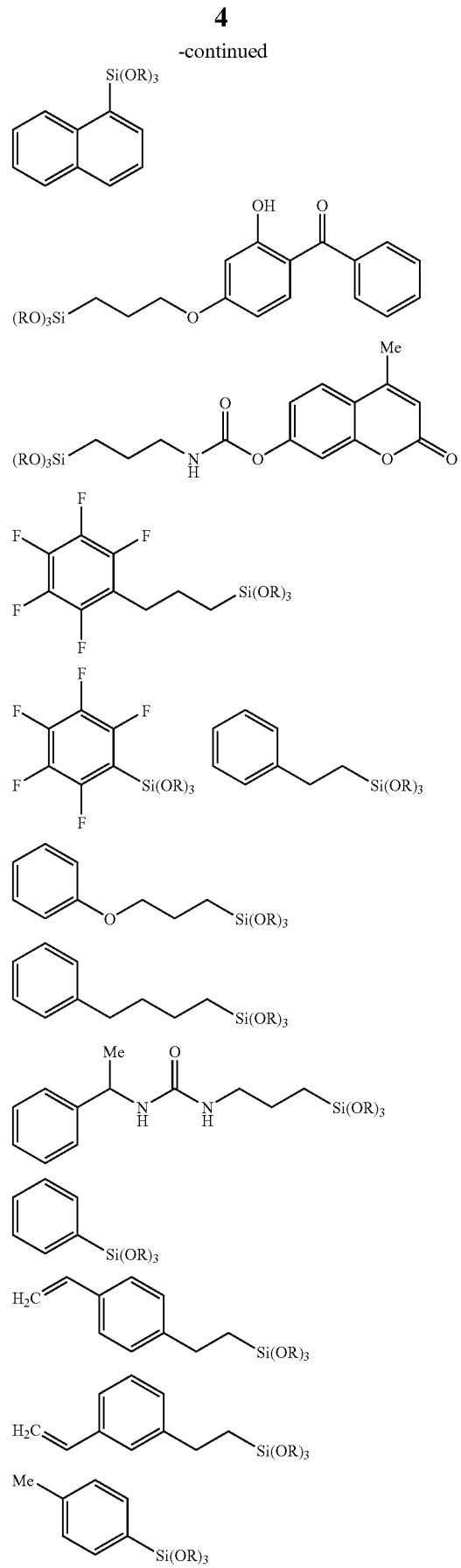

-continued

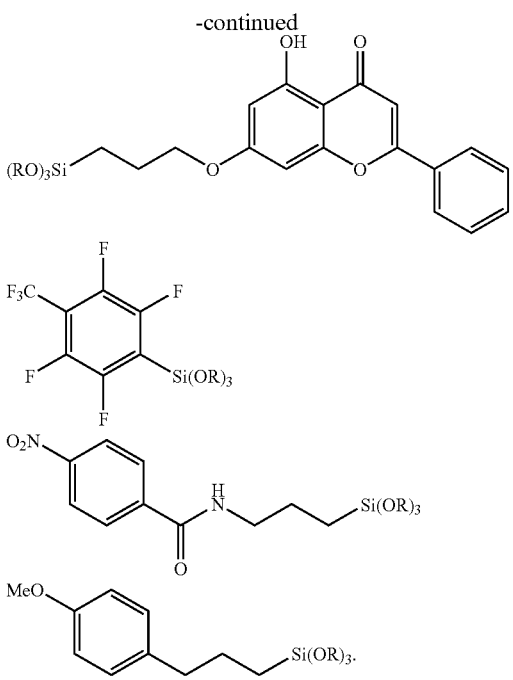

The composition may further include one or more of pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, tetrabutylammonium nitrate, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluenesulfonate, or tetrabutylammonium phosphate.

The composition may further include one or more of a crosslinker, a radical stabilizer, or a surfactant.

At least one of the above and other features and advantages may also be realized by providing a method of forming a hardmask composition having a solvent and an organosilicon copolymer, including preparing the organosilicon copolymer by copolymerizing about 5 to about 90 parts by weight of a first monomer represented by Formula 2 and about 5 to about 90 parts by weight of a second monomer represented by Formula 3:

The parts by weight may be based on the total weight of the first and second monomers. In Formula 2, $R^3$ may be a $C_1$-$C_{12}$ alkyl group, and in Formula 3, Y may be a linking group including a substituted or unsubstituted, linear or branched $C_1$-$C_{20}$ alkyl group, a $C_1$-$C_{20}$ group containing a chain that includes an aromatic ring, a heterocyclic ring, a urea group or an isocyanurate group, or a $C_2$-$C_{20}$ group containing one or more multiple bonds. The method may further include combining the solvent with the organosilicon copolymer.

Preparing the organosilicon copolymer may include hydrolyzing and/or condensing, in the presence of an acid catalyst, a first precursor compound represented by Formula 5 and a second precursor compound represented by Formula 6:

In Formula 5, $R^2$ may be a $C_1$-$C_6$ alkyl group and $R^3$ may be the same as in Formula 2, and in Formula 6, $R^4$ and $R^5$ may each independently be a $C_1$-$C_6$ alkyl group, and Y may be the same as in Formula 3.

The second precursor compound represented by Formula 6 may be a substituted or unsubstituted one of the following compounds:

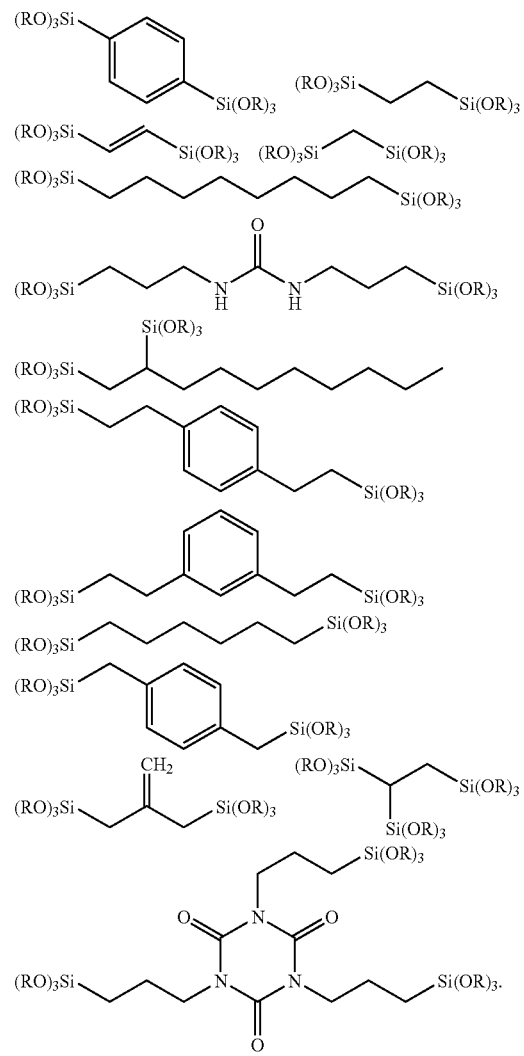

Preparing the organosilicon copolymer may further include copolymerizing, with the first and second monomers, greater than 0 parts by weight and less than about 90 parts by weight of a third monomer containing a chromophore group X and represented by Formula 4:

In Formula 4, the parts by weight of the first, second and third monomers may be based on the combined weight of the first, second and third monomers, and X may be a $C_6$-$C_{30}$ group containing at least one substituted or unsubstituted aromatic ring.

Preparing the organosilicon copolymer may include hydrolyzing and/or condensing, in the presence of an acid catalyst, a first precursor compound represented by Formula 5, a second precursors compound represented by Formula 6, and a third precursor compound represented by Formula 7:

$$[R^2O]_3Si\text{—}R^3 \quad (5)$$

$$[R^4O]_3Si\text{—}Y\text{—}Si[OR^5]_3 \quad (6)$$

$$[R^1O]_3Si\text{—}X \quad (7).$$

In Formula 5, $R^2$ may be a $C_1$-$C_6$ alkyl group and $R^3$ may be the same as in Formula 2, in Formula 6, $R^4$ and $R^5$ may each independently be a $C_1$-$C_6$ alkyl group, and Y may be the same as in Formula 3, and in Formula 7, $R^1$ may be a $C_1$-$C_6$ alkyl group and X may be the same as in Formula 4.

The second precursor compound represented by Formula 6 may be a substituted or unsubstituted one of the following compounds:

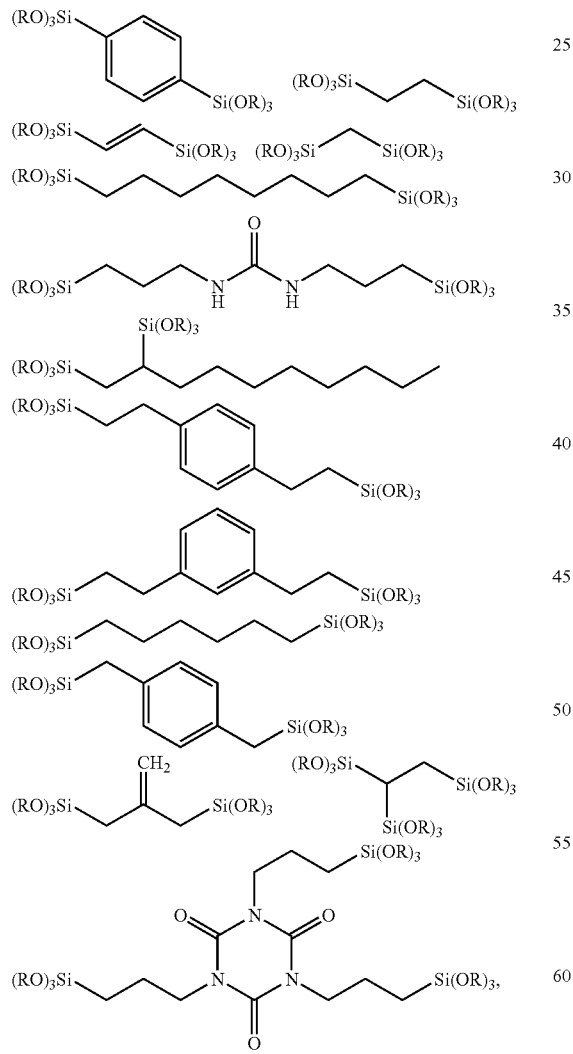

and the third precursor compound represented by Formula 7 may be a substituted or unsubstituted one of the following compounds:

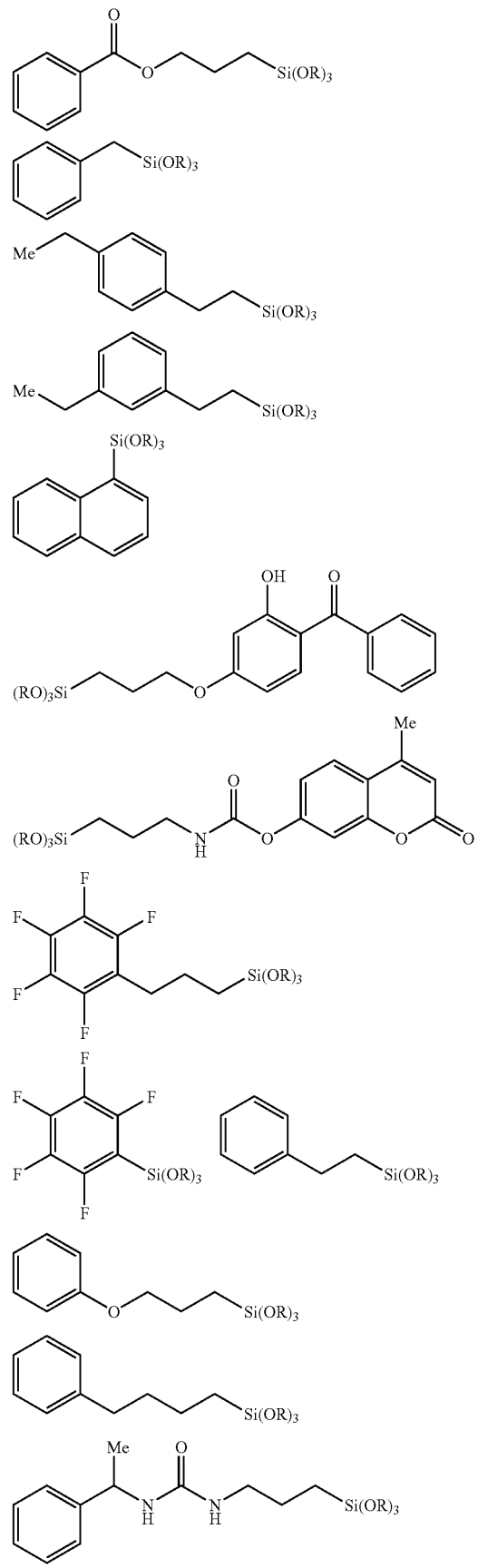

-continued

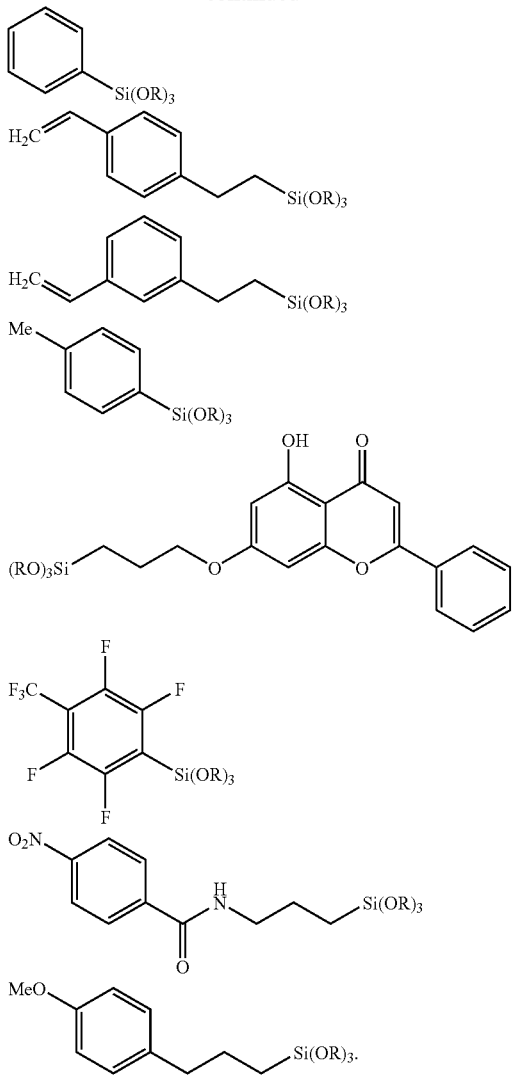

The organosilicon polymer may be prepared in the presence of about 100 to about 900 parts by weight of a reaction solvent and about 0.001 to about 5 parts by weight of an acid catalyst, wherein the parts by weight are based on the total weight of the first, the second and the third monomers.

At least one of the above and other features and advantages may also be realized by providing a method of producing a device, including providing a material layer on a substrate, forming a first hardmask layer of an organic material on the material layer, coating the hardmask composition according to an embodiment on the first hardmask layer to form a second hardmask layer, forming a radiation-sensitive imaging layer on the second hardmask layer, patternwise exposing the imaging layer to radiation to form a pattern of radiation-exposed regions within the imaging layer, selectively removing portions of the radiation-sensitive imaging layer and the second hardmask layer to expose portions of the first hardmask layer, selectively removing portions of the first hardmask layer to expose portions of the material layer, and etching the exposed portions of the material layer to form a pattern in the material layer.

The method may further include forming an antireflective coating on the second hardmask layer prior to forming the radiation-sensitive imaging layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
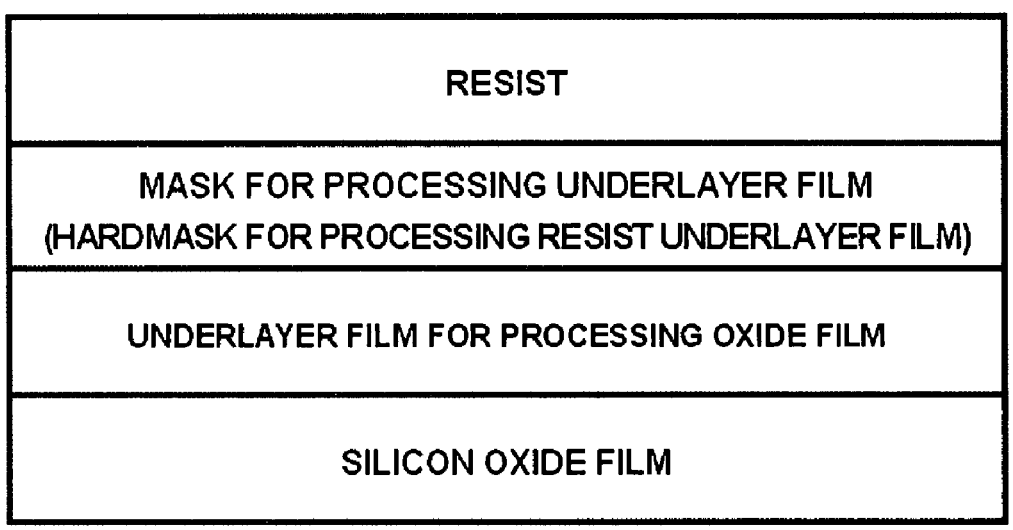
FIG. 1 illustrates a schematic cross-sectional view of a multilayer structure having an oxide film, an underlayer film for processing the oxide film, a hardmask for processing the underlayer film, and a resist.

Korean Patent Application No. 10-2006-0115411, filed on Nov. 21, 2006, in the Korean Intellectual Property Office, and entitled: "Hardmask Composition for Processing Resist Underlayer Film, Process for Producing Semiconductor Integrated Circuit Device Using the Hardmask Composition, and Semiconductor Integrated Circuit Device Produced by the Process," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, "silyl hydride" refers to the moiety Si—H.

Embodiments provide a hardmask composition, which may be used for processing a resist underlayer film. The hardmask composition my provide antireflective properties. The hardmask composition may include a solvent in combination with an organosilicon copolymer represented by Formula 1:

$$\{(SiO_{1.5}-Y-SiO_{1.5})_x(R^3SiO_{1.5})_y(XSiO_{1.5})_z\}_n \qquad (1)$$

In Formula 1, the component corresponding to the fraction z may be omitted. In an implementation, the fractions x, y and z may satisfy the following relations:

$$0.05 \leq x \leq 0.9, 0.05 \leq y \leq 0.9, \text{ and } 0 \leq z \leq 0.9; \text{ and}$$

$$x+y+z=1.$$

In Formula 1, $R^3$ may be a $C_1$-$C_{12}$ alkyl group. In Formula 1, Y may be a linking group. In an implementation, the linking group may be a substituted or unsubstituted, linear or branched $C_1$-$C_{20}$ alkyl group. In an implementation, the linking group may be a $C_1$-$C_{20}$ alkyl group containing an aromatic ring, a heterocyclic ring, a urea group or an isocyanurate group in the backbone. In an implementation, the linking group may be a $C_2$-$C_{20}$ hydrocarbon group containing one or more multiple bonds. In an implementation, Y may be a linking group having a chain of between 1 and 9 atoms, i.e., in Formula 1, two silicon atoms may be separated by a chain having between 1 and 9 atoms. In Formula 1, X may be a $C_6$-$C_{30}$ functional group containing at least one substituted or unsubstituted aromatic ring. In Formula 1, n may be from about 12 to about 2,000, which may enhance the coatability of the hardmask composition.

The organosilicon copolymer may be a polycondensation product of monomer compounds represented by Formulae 2, 3, and, optionally, 4:

$$[HO]_3Si-R^3 \qquad (2)$$

$$[HO]_3Si-Y-Si[OH]_3 \qquad (3)$$

$$[HO]_3Si-X \qquad (4)$$

In Formulae 2, 3 and 4, $R^3$, Y, and X are as described in Formula 1.

Figure 4:
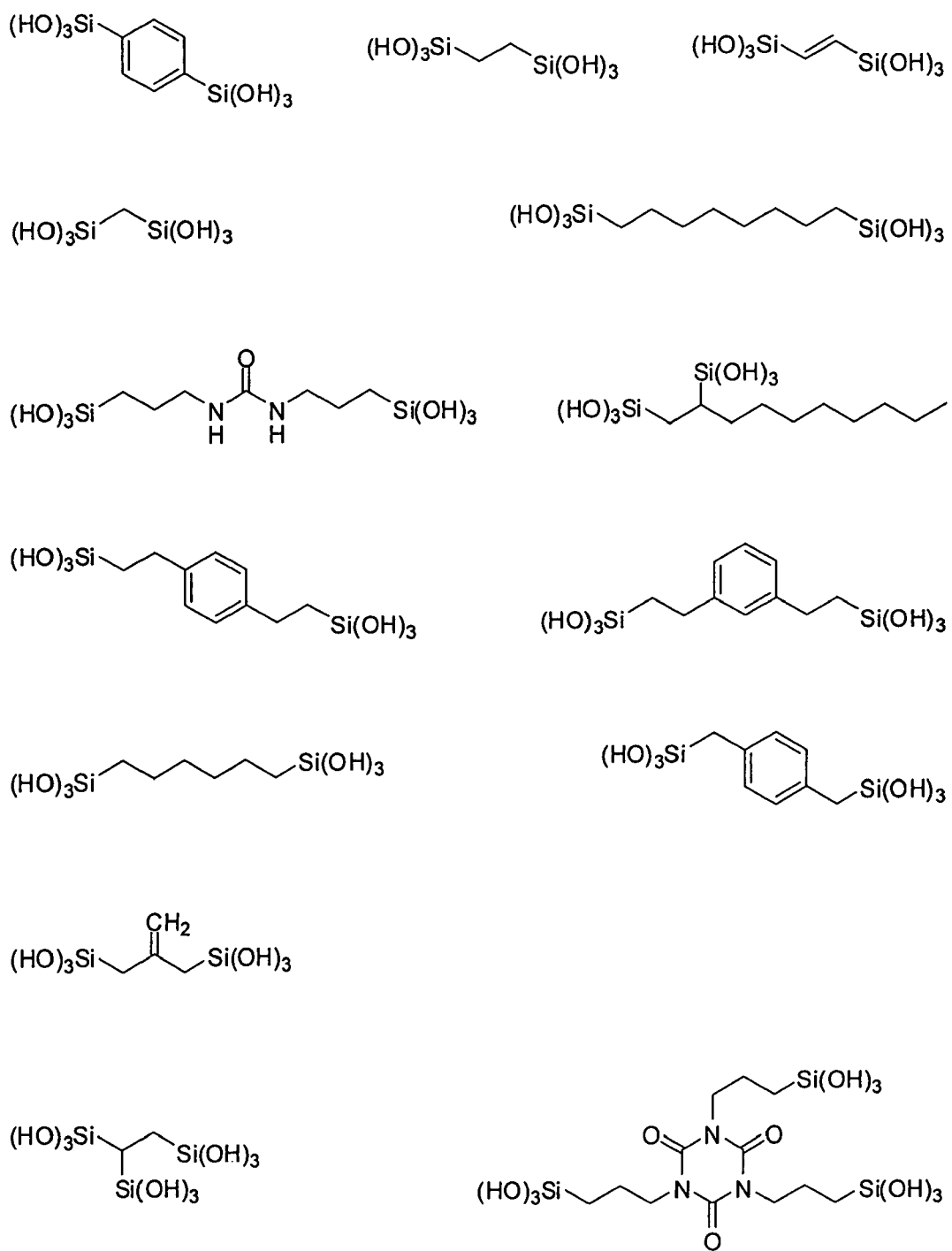
Figure 5:
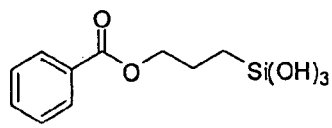
Figure 5:
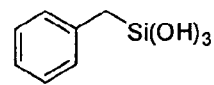
Figure 5:
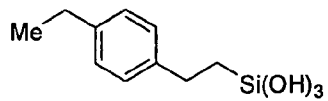
Figure 5:
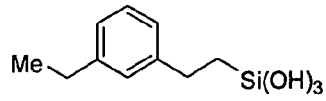
Figure 5:
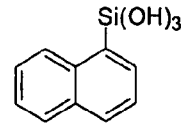
Figure 5:
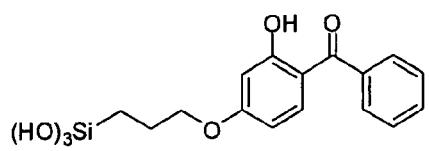
Figure 5:
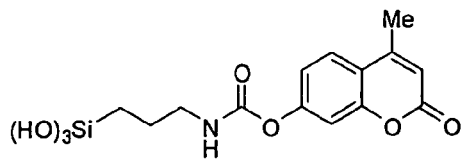
Figure 5:
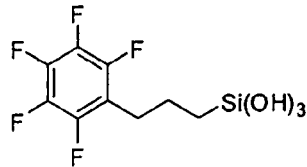
Figure 5:
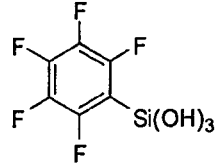
Figure 5:
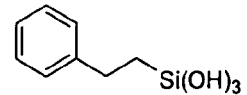
Figure 5:
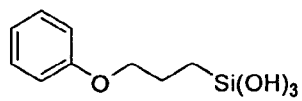
Figure 5:
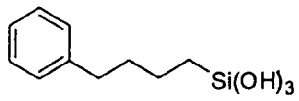
Figure 5:
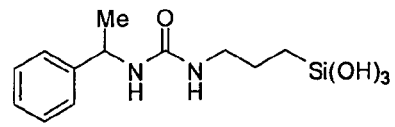
Figure 5:
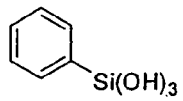
Figure 5:
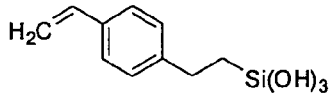
Figure 5:
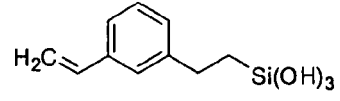
Figure 5:
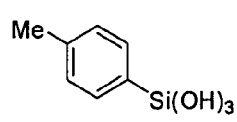
Figure 5:
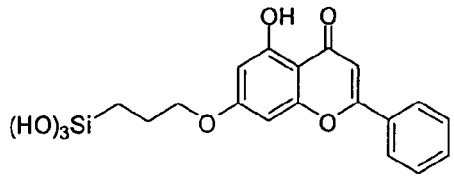
Figure 5:
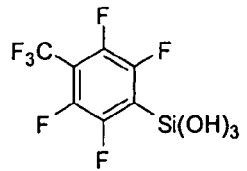
Figure 5:
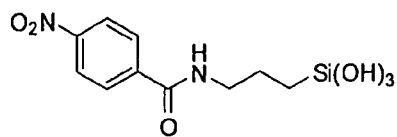
Figure 5:
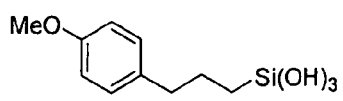

The compounds represented by Formulae 2, 3 and 4 may be hydrolysates of precursor compounds represented by respective Formulae 5, 6 and 7, which are described below. Exemplary compounds represented by Formulae 3 and 4 are illustrated in FIGS. 4 and 5, respectively.

An increase in the relative amount of the compound of Formula 2 used in the organosilicon copolymer may provide better storage stability of the hardmask composition. It is preferred to use the compound represented by Formula 2 in an amount of about 5 to about 90 parts by weight, based on 100 parts by weight of the compounds represented by Formulae 2, 3 and 4. Using greater than about 5 parts by weight may help improve the storage stability of the hardmask composition. Using less than about 90 parts by weight may avoid unduly lowering the absorbance of the hardmask composition and may enhance antireflective properties.

An increase in the relative amount of the compound represented by Formula 3 used may improve the etch resistance of the hardmask composition. It is preferred to use the compound represented by Formula 3 in an amount of about 5 to about 90 parts by weight, based on 100 parts by weight of the compounds of Formulae 2, 3 and 4. Using more than about 5 parts by weight may enhance the etch resistance of the hardmask composition due to an increased Si content. Using less than about 90 parts by weight may improve the storage stability of the hardmask composition.

In the compound represented by Formula 3, the hydrocarbon groups present between the Si atoms may limit the degree of freedom of Si—OH groups. Accordingly, when the proportion of the compound represented by Formula 3 is relatively increased, the number of the Si—OH groups exposed to the surface may increase. As a result, a thin film formed using the hardmask composition having a higher proportion of Formula 3 may show a lower contact angle, and the thin film may be more hydrophilic. Accordingly, the hardmask composition may be effective in improving the interfacial compatibility of the thin film with an overlying antireflective coating by controlling hydrophilicity.

The substituted or unsubstituted aromatic group included in the compound represented by Formula 4 may absorb UV light in the deep UV (DUV) region. Accordingly, when this compound is included in the organosilicon copolymer, the hardmask composition may exhibit enhanced antireflective properties. Further, the hardmask composition may have desirable absorbance and refractive index characteristic at a particular wavelength by controlling the number of the substituted or unsubstituted aromatic groups in the organosilicon polymer.

The compound represented by Formula 4 may be used in an amount of 0 to about 90 parts by weight, based on 100 parts by weight of the compounds of Formulae 2, 3 and 4. When the compound represented by Formula 4 is used in an amount greater than 0 and less than about 90 parts by weight, the antireflective properties of the hardmask composition may be enhanced due to the presence of substituted or unsubstituted aromatic groups, which may avoid the need for an additional antireflective coating. However, if desired in order to further improve the absorbance and photo profile, the additional antireflective coating may also be used. Omission of the compound represented by Formula 4 (i.e. 0 parts) may result in the need for an additional antireflective coating, depending on the particular application. If the compound represented by Formula 4 is used in an amount exceeding about 90 parts by weight, the overall Si content may be reduced, which may negatively impact etch selectivity. Suitable antireflective properties may be attained by controlling the relative amount of the compound represented by Formula 4.

The amount of the organosilicon polymer used in the hardmask composition is preferably about 1 to about 50 parts by weight, and more preferably about 1 to about 30 parts by weight, based on 100 parts by weight of the hardmask composition. Maintaining the amount of the organosilicon polymer with about 1 to about 50 parts by weight may enhance coatability of the hardmask composition.

The solvent used in the hardmask composition may be a single solvent, or a mixture of two or more solvents. When a mixture of two or more solvents is used in the hardmask composition, at least one solvent may be a high-boiling point solvent. The high-boiling point solvent acts to prevent formation of voids and allows a film to be dried at a low rate, thus improving flatness of the film. As used herein, the term "high-boiling point solvent" refers to a solvent that is evaporated at a temperature lower than temperatures required to coat, dry and cure the hardmask composition of the present invention.

Examples of solvents suitable for use in the hardmask composition include acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, or γ-butyrolactone, or mixtures thereof. The solvent may be the same as or different from a reaction solvent used to prepare the organosilicon copolymer.

The hardmask composition may further include a crosslinking catalyst to help promote the crosslinking of the organosilicon copolymer, which may improve the etch resistance and solvent resistance of the hardmask composition. The crosslinking catalyst may include one or more acid salts of organic bases, such as pyridinium p-toluenesulfonate, amidosulfobetain-16 and (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, tetrabutylammonium nitrate, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluenesulfonate, and tetrabutylammonium phosphate. The crosslinking catalyst is preferably used in an amount of about 0.0001 to about 0.01 parts by weight, based on 100 parts by weight of the organosilicon copolymer. Using more than about 0.0001 parts by weight may help ensure that crosslinking is sufficiently promoted, and using less than about 0.01 parts by weight may help avoid undue reductions in the storage stability of the hardmask composition.

In an implementation, the hardmask composition may include the crosslinking catalyst with one or more additives such as crosslinkers, radical stabilizers and/or surfactants.

Another embodiment provides a method of forming the organosilicon copolymer used in the hardmask composition. The organosilicon copolymer represented by Formula 1 may be prepared in the presence of an acid catalyst by hydrolysis and polycondensation of precursor compounds represented by Formulae 5 and 6:

[R$^2$O]$_3$Si—R$^3$   (5)

[R$^4$O]$_3$Si—Y—Si[OR$^5$]$_3$   (6)

In Formula 5, R$^2$ may be a C$_1$-C$_6$ alkyl group and R$^3$ is as described in Formula 1. In Formula 6, R$^4$ and R$^5$ may each independently be a C$_1$-C$_6$ alkyl group, and Y is as described in Formula 1.

In another implementation, the organosilicon polymer may be prepared in the presence of an acid catalyst by hydrolysis and polycondensation of the precursor compounds represented by Formulae 5 and 6 in combination with a precursor compound represented by Formula 7:

[R$^1$O]$_3$Si—X  (7)

In Formula 7, R$^1$ may be a C$_1$-C$_6$ alkyl group and X is as described in Formula 1.

Figure 2:
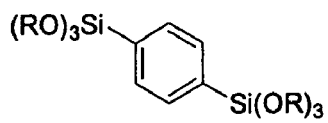
FIGS. 2 and 4 respectively illustrate exemplary compounds represented by Formula 6 and the corresponding hydrolysates represented by Formula 3.
Figure 2:
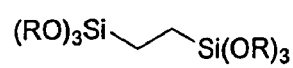
Figure 2:
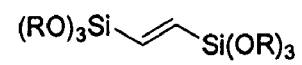
Figure 2:
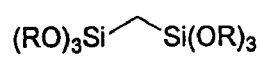
Figure 2:
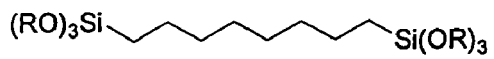
Figure 2:
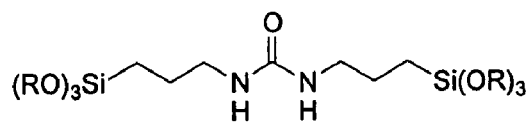
Figure 2:
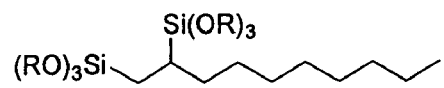
Figure 2:
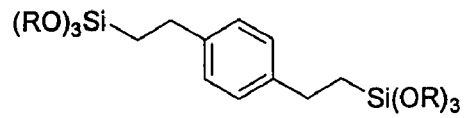
Figure 2:
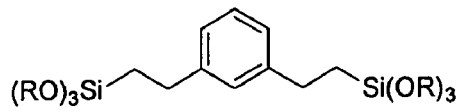
Figure 2:
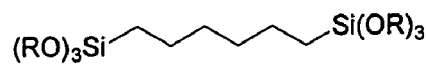
Figure 2:
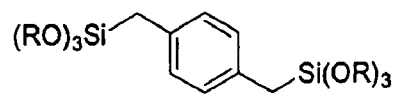
Figure 2:
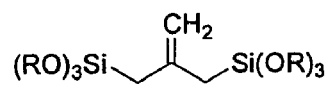
Figure 2:
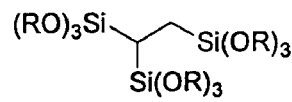
Figure 2:
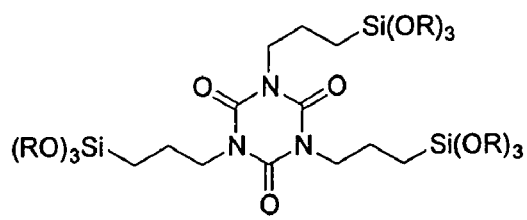
Figure 3:
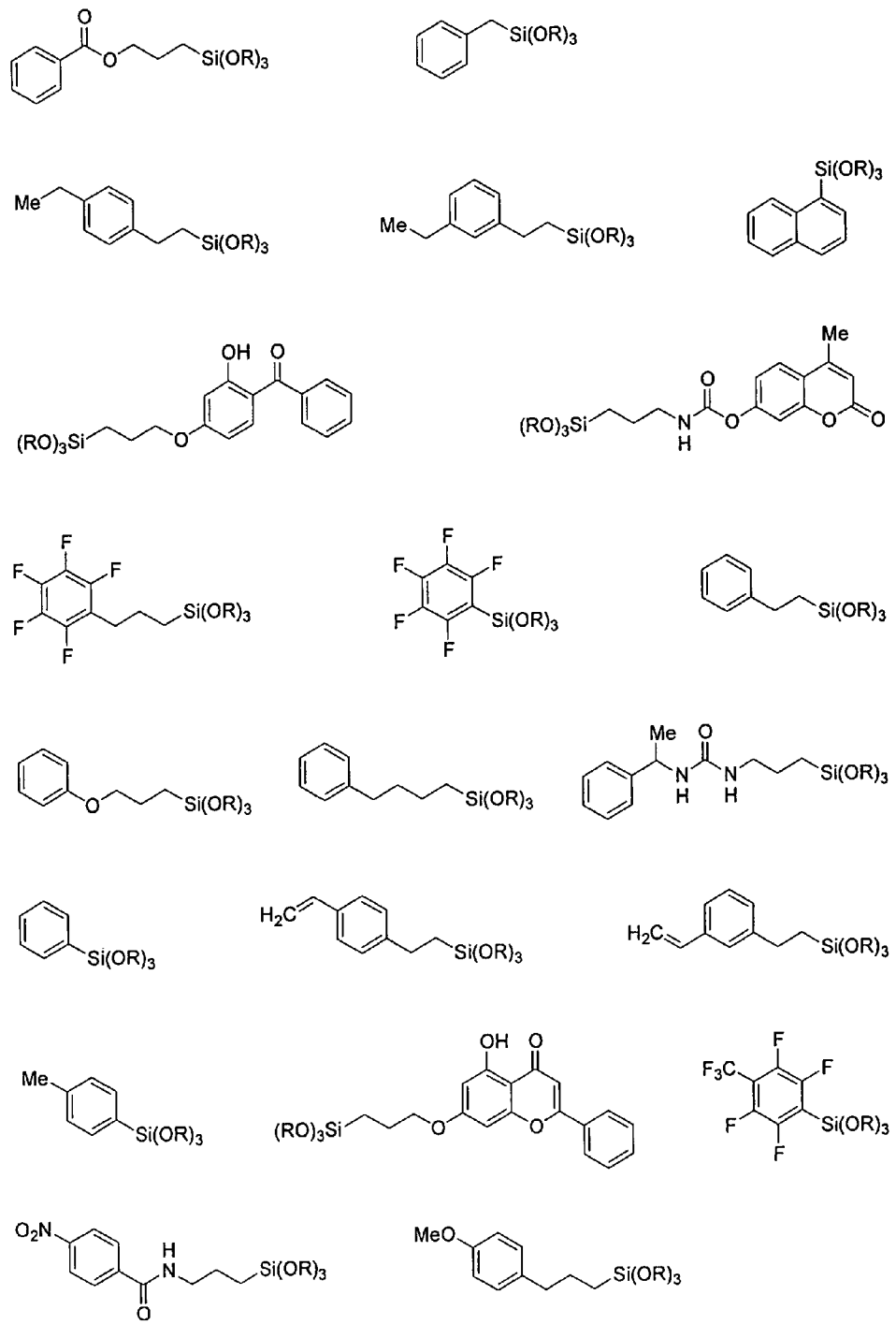
FIGS. 3 and 5 respectively illustrate exemplary compounds represented by Formula 7 and the corresponding hydrolysates represented by Formula 4.

Specific exemplary compounds corresponding to Formulae 6 and 7 are shown in FIGS. 2 and 3, respectively, in which "Me" represents a methyl group and "R" represents a C$_1$-C$_6$ alkyl group. In exemplary implementations, either of the following two compounds shown in FIG. 2 may be used:

In exemplary implementations, either of the following two compounds shown in FIG. 3 may be used:

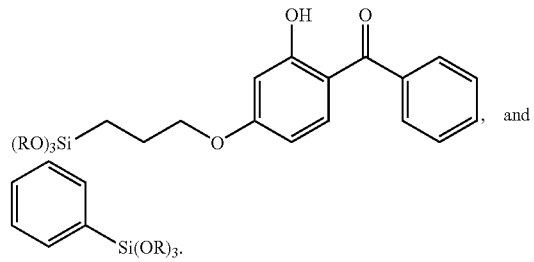

The hydrolysis of the compounds of Formulae 5, 6 and 7, e.g., in the presence of an acid catalyst, leads to the hydrolysates represented by the above-described Formulae 2, 3 and 4, respectively.

In an implementation, the organosilicon copolymer may be prepared by mixing: (a) an amount of the compound represented by Formula 5 that corresponds to about 5 to about 90 parts by weight of the respective compound represented by Formula 2, (b) an amount of the compound represented by Formula 6 that corresponds to about 5 to about 90 parts by weight of the respective compound represented by Formula 3, and, when included, (c) an amount of the compound represented by Formula 7 that corresponds to more than 0 and less than about 90 parts by weight of the respective compound represented by Formula 4, wherein the parts by weight are with respect to 100 parts by weight of the compounds represented by Formulae 2, 3 and 4. The mixture of (a) and (b), with or without (c), may be allowed to react in about 100 to about 900 parts by weight of a reaction solvent in the presence of about 0.001 to about 5 parts by weight of an acid catalyst.

The reaction solvent may include one or more of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, or γ-butyrolactone, or mixtures thereof.

The acid catalyst may include one or more of: inorganic acids, such as nitric acid, sulfuric acid and hydrochloric acid; organic acids, such as p-toluenesulfonic acid monohydrate and diethyl sulfate; or mixtures thereof.

The hydrolysis or condensation reaction may be suitably controlled by varying the kind, the amount and the mode of addition of the acid catalyst. In the formation reactions of the organosilicon copolymer, the acid catalyst may be used in an amount of about 0.001 to about 5 parts by weight. The use of the acid catalyst in an amount greater than about 0.001 parts by weight may provide a satisfactorily fast reaction rate, while the use of the acid catalyst in an amount less than about 5 parts by weight may avoid an excessive increase in the reaction rate that could make it difficult to prepare polycondensation products having a desired molecular weight.

Another embodiment provides a process for producing a device, e.g., a semiconductor integrated circuit device, and may include: (a) providing a material layer on a substrate, (b) forming a first hardmask layer composed of an organic material on the material layer, (c) coating the hardmask composition according to an embodiment on the first hardmask layer to form a second hardmask layer, (d) forming a radiation-sensitive imaging layer on the second hardmask layer, (e) patternwise exposing the imaging layer to radiation to form a pattern of radiation-exposed regions within the imaging layer, (f) selectively removing portions of the radiation-sensitive imaging layer and the second antireflective hardmask layer to expose portions of the first hardmask layer, (g) selectively removing portions of the first hardmask layer to expose portions of the material layer, and (h) etching the exposed portions of the material layer using the first hardmask layer as a mask to pattern the material layer.

In an implementation, when the compound represented by Formula 4 is omitted from the organosilicon copolymer represented by Formula 1, or it is desired to further improve the absorbance and photo profile, an antireflective coating may be formed on the second hardmask layer prior to step (d).

The hardmask composition and the device fabrication process according to the above-described embodiments may be employed in the formation of patterned material layer structures, e.g., metal wiring lines, contact holes and biases, insulating sections, e.g., damascene trenches and shallow trench isolation, trenches for capacitor structures, e.g., trenches used in the design of integrated circuit devices, etc. The hardmask composition and the device fabrication process according to the above-described embodiments may be particularly suitable for the formation of patterned oxide, nitride, polysilicon and chromium layers. Embodiments may also provide a semiconductor integrated circuit device produced by the semiconductor fabrication process.

The following Examples are provided in order to set forth particular details of one or more example embodiments. However, it will be understood that the embodiments described herein are not limited to the particular details described in the Examples.

EXAMPLES

Comparative Example 1

1,750 g of methyltrimethoxysilane, 340 g of phenyltrimethoxysilane and 313 g of trimethoxysilane were dissolved in 5,600 g of propylene glycol monomethyl ether acetate (PGMEA) in a 10-liter four-neck flask equipped with a mechanical agitator, a condenser, a dropping funnel and a nitrogen inlet tube, and then 925 g of an aqueous nitric acid solution (1,000 ppm) was added thereto. After the resulting mixture was allowed to react at 60° C. for one hour, the formed methanol byproduct was removed under reduced pressure. The reaction was continued for one week while maintaining the reaction temperature at 50° C. After completion of the reaction, hexane was added to the reaction mixture to precipitate a polymer represented by Formula 8:

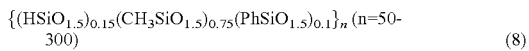
$$\{(HSiO_{1.5})_{0.15}(CH_3SiO_{1.5})_{0.75}(PhSiO_{1.5})_{0.1}\}_n \text{ (n=50-300)} \quad (8)$$

2.0 g of the polymer was added to 50 g of PGMEA and 50 g of ethyl lactate to prepare a dilute solution of the polymer. 0.002 g of pyridinium p-toluenesulfonate was added to the dilute solution. The resulting solution was spin-coated on a silicon wafer, followed by baking at 240° C. for 60 seconds to form a 500 Å-thick film.

Example 1

1,375 g of methyltrimethoxysilane, 286 g of phenyltrimethoxysilane and 740 g of bis(trimethoxysilyl)methane were dissolved in 5,600 g of PGMEA in a 10-liter four-neck flask equipped with a mechanical agitator, a condenser, a dropping funnel and a nitrogen inlet tube, and then 654 g of an aqueous nitric acid solution (1,000 ppm) was added thereto. After the resulting mixture was allowed to react at 50° C. for one hour, the formed methanol byproduct was removed under reduced pressure. The reaction was continued for one week while maintaining the reaction temperature at 80° C. After completion of the reaction, hexane was added to the reaction mixture to precipitate a polymer represented by Formula 9:

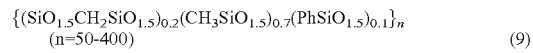
$$\{(SiO_{1.5}CH_2SiO_{1.5})_{0.2}(CH_3SiO_{1.5})_{0.7}(PhSiO_{1.5})_{0.1}\}_n \text{ (n=50-400)} \quad (9)$$

The polymer was filtered to obtain a sample. 2.0 g of the sample was added to 100 g of PGMEA to prepare a dilute solution. 0.002 g of pyridinium p-toluenesulfonate was added to the dilute solution. The resulting solution was spin-coated on a silicon wafer, followed by baking at 240° C. for 60 seconds to form a 500 Å-thick film.

Example 2

1,632 g of methyltrimethoxysilane and 768 g of bis(trimethoxysilyl)methane were dissolved in 5,600 g of PGMEA in a 10-liter four-neck flask equipped with a mechanical agitator, a condenser, a dropping funnel and a nitrogen inlet tube, and then 654 g of an aqueous nitric acid solution (1,000 ppm) was added thereto. After the resulting mixture was allowed to react at 50° C. for one hour, the formed methanol byproduct was removed under reduced pressure. The reaction was continued for one week while maintaining the reaction temperature at 50° C. After completion of the reaction, hexane was added to the reaction mixture to precipitate a polymer represented by Formula 10:

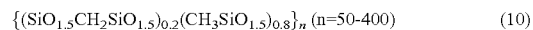
$$\{(SiO_{1.5}CH_2SiO_{1.5})_{0.2}(CH_3SiO_{1.5})_{0.8}\}_n \text{ (n=50-400)} \quad (10)$$

The polymer was filtered to obtain a sample. 2.0 g of the sample was added to 100 g of PGMEA to prepare a dilute solution. 0.002 g of pyridinium p-toluenesulfonate was added to the dilute solution. The resulting solution was spin-coated on a silicon wafer, followed by baking at 240° C. for 60 seconds to form a 500 Å-thick film.

Example 3

686 g of methyltrimethoxysilane and 1,714 g of bis(trimethoxysilyl)methane were dissolved in 5,600 g of PGMEA in a 10-liter four-neck flask equipped with a mechanical agitator, a condenser, a dropping funnel and a nitrogen inlet tube, and then 462 g of an aqueous nitric acid solution (1,000 ppm) was added thereto. After the resulting mixture was allowed to react at 50° C. for one hour, the formed methanol byproduct was removed under reduced pressure. The reaction was continued for 3 days while maintaining the reaction temperature at 50° C. After completion of the reaction, hexane was added to the reaction mixture to precipitate a polymer represented by Formula 11:

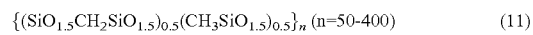
$$\{(SiO_{1.5}CH_2SiO_{1.5})_{0.5}(CH_3SiO_{1.5})_{0.5}\}_n \text{ (n=50-400)} \quad (11)$$

The polymer was filtered to obtain a sample. 2.0 g of the sample was added to 100 g of PGMEA to prepare a dilute solution. 0.002 g of pyridinium p-toluenesulfonate was added to the dilute solution. The resulting solution was spin-coated on a silicon wafer, followed by baking at 240° C. for 60 seconds to form a 500 Å-thick film.

Example 4

189 g of phenyltrimethoxysilane, 519 g of methyltrimethoxysilane and 1,691 g of bis(triethoxysilyl)ethane were dissolved in 5,600 g of PGMEA in a 10-liter four-neck flask equipped with a mechanical agitator, a condenser, a dropping funnel and a nitrogen inlet tube, and then 541 g of an aqueous nitric acid solution (1,000 ppm) was added thereto. After the resulting mixture was allowed to react at 50° C. for one hour, the formed methanol and ethanol byproducts were removed under reduced pressure. The reaction was continued for 3 days while maintaining the reaction temperature at 50° C. After completion of the reaction, hexane was added to the reaction mixture to precipitate a polymer represented by Formula 12:

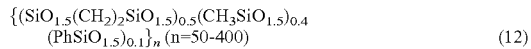
$\{(SiO_{1.5}(CH_2)_2SiO_{1.5})_{0.5}(CH_3SiO_{1.5})_{0.4}(PhSiO_{1.5})_{0.1}\}_n$ (n=50-400)     (12)

The polymer was filtered to obtain a sample. 2.0 g of the sample was added to 100 g of PGMEA to prepare a dilute solution. 0.002 g of pyridinium p-toluenesulfonate was added to the dilute solution. The resulting solution was spin-coated on a silicon wafer, followed by baking at 240° C. for 60 seconds to form a 500 Å-thick film.

Experimental Example 1

The solutions prepared in Comparative Example 1 and Examples 1 to 4 were tested for storage stability. Three samples of each solution were stored at 40° C. At intervals of 10 days, the molecular weight of the polymer in the samples and the thickness of the films obtained after coating of the samples were measured. The results are shown in Table 1.

TABLE 1

| Sample | After 10 days | | After 20 days | | After 30 days | |
|---|---|---|---|---|---|---|
| | Normalized molecular weight | Thickness (Å) | Normalized molecular weight | Thickness (Å) | Normalized molecular weight | Thickness (Å) |
| Comparative Example 1 | 1.1 | 512 | 1.8 | 532 | Particles observed | Poor coatability |
| Example 1 | 1.0 | 502 | 1.0 | 503 | 1.0 | 505 |
| Example 2 | 1.0 | 503 | 1.0 | 504 | 1.0 | 506 |
| Example 3 | 1.0 | 503 | 1.0 | 503 | 1.0 | 505 |
| Example 4 | 1.0 | 502 | 1.0 | 503 | 1.0 | 503 |

The normalized molecular weight as shown in Table 1 refers to a value obtained by dividing the molecular weight of the corresponding polymer measured after the indicated time of storage by the molecular weight of the polymer measured immediately after the preparation of the hardmask composition. An increase in the molecular weight of the polymer prepared in Comparative Example 1 after the indicated time intervals of storage was observed. In contrast, the molecular weights of the polymers prepared in Examples 1 to 4 were maintained even after the indicated time intervals, indicating high storage stability of the polymers.

The polymers prepared using the bis(silyl) monomers in Examples 1 to 4 had a high Si content, without the use of an additional silyl hydride compound, and were highly stable during storage.

Experimental Example 2

The films formed in Comparative Example 1 and Examples 1 to 4 were measured for refractive index (n) and extinction coefficient (k) using an ellipsometer obtained from J.A. Woollam Co., Inc. (U.S.A.). The results of these measurements are shown in Table 2.

TABLE 2

| Sample used in the formation of film | Optical properties (193 nm) | |
|---|---|---|
| | Refractive index (n) | Extinction coefficient (k) |
| Comparative Example 1 | 1.71 | 0.23 |
| Example 1 | 1.70 | 0.19 |
| Example 2 | 1.56 | 0.00 |
| Example 3 | 1.59 | 0.00 |
| Example 4 | 1.69 | 0.15 |

As can be seen from the results in Table 2, taking advantage of the ability of the substituted or unsubstituted aromatic groups included in the polymers to absorb UV light in the deep UV (DUV) region, the solutions prepared in Examples 1 and 4 showed antireflective properties.

Experimental Example 3

The films formed in Comparative Example 1 and Examples 1 to 4 were measured for contact angle with water using a contact angle measurement system Phoenix 300 plus, obtained from Surface Electro Optics Co. Ltd. (Korea). 10 μl of water was dropped onto the surface (five points) of each of the films. The angles between the surface of the film and the drops of water were measured. The results are shown in Table 3.

TABLE 3

| | Contact angle | | | | | |
|---|---|---|---|---|---|---|
| | Point 1 (°) | Point 2 (°) | Point 3 (°) | Point 4 (°) | Point 5 (°) | Average (°) |
| Comparative Example 1 | 87.2 | 90.5 | 87.2 | 86.3 | 88.7 | 87.9 |
| Example 1 | 84.3 | 80.6 | 89.4 | 84.3 | 82.2 | 84.1 |
| Example 2 | 82.0 | 82.0 | 84.3 | 79.2 | 80.6 | 81.6 |
| Example 3 | 66.2 | 72.4 | 72.4 | 78.4 | 74.9 | 72.8 |
| Example 4 | 73.6 | 74.9 | 74.9 | 74.9 | 73.6 | 74.3 |

The results in Table 3 demonstrate that polymers having desired surface characteristics can be readily synthesized by appropriately optimizing the feeding ratio of the compounds represented by Formulae 2, 3 and 4. Particularly, as the proportion of the compound represented by Formula 3 in the polymers was increased, the surface characteristics of the polymers became more hydrophilic.

Experimental Example 4

Bulk dry etching without any pattern was performed on the films of Comparative Example 1 and Examples 1 to 4 for 100 seconds under the following plasma conditions: 90 mT, 400 W/250 W, 24 $N_2$, 12 $O_2$, 500 Ar. After etching, the thickness of the films was measured to calculate etch rates per unit time. $N_2$ and Ar were used as flowing gases and $O_2$ was used as a main etching gas. The results are shown in Table 4.

TABLE 4

| Sample | Si content (%) | Thickness (Å) after etching | Thickness variation (Å) | Etch rate (Å/sec.) |
|---|---|---|---|---|
| Comparative Example 1 | 41 | 245 | 255 | 2.55 |
| Example 1 | 41 | 264 | 236 | 2.36 |
| Example 2 | 43 | 316 | 184 | 1.84 |
| Example 3 | 45 | 369 | 131 | 1.31 |
| Example 4 | 41 | 310 | 190 | 1.90 |

The polymers prepared using the bis(silyl) monomers in Examples 1 to 4 had almost the same Si content as the polymer prepared in Comparative Example 1. The results of Table 4 demonstrate that films having a desired Si content can be readily synthesized by appropriately optimizing the feeding ratio of the compounds of Formulae 2, 3 and 4. In addition, it was confirmed that the films showed improved etch resistance against $O_2$ plasma as the Si content increased (Examples 1, 2 and 3). Although the Si content of the film formed using a bis(silyl) monomer in Example 4 was the same as that of the film formed in Comparative Example 1, the film formed in Example 4 showed better etch resistance due to its more resistant structure.

Experimental Example 5

ArF photoresists were coated on each of the films formed in Comparative Example 1 and Examples 1 to 4, baked at 110° C. for 60 seconds, exposed to light using an ArF exposure system (ASML1250, NA 0.82), and developed with an aqueous solution of TMAH (2.38 wt %) to form an 80-nm line and space pattern. An additional antireflective coating was formed on the films formed in Examples 2 and 3. The patterns were observed using a CD-SEM. The patterns were measured for exposure latitude (EL) margin as a function of exposure energy and depth of focus (DoF) margin as a function of the distance from a light source. The results are shown in Table 5.

TABLE 5

| | Pattern Characteristics | |
|---|---|---|
| Sample used in the formation of film | EL margin (ΔmJ/exposure energy mJ) | DoF margin (μm) |
| Comparative Example 1 | 0.2 | 0.2 |
| Example 1 | 0.2 | 0.2 |
| Example 2 | 0.2 | 0.2 |
| Example 3 | 0.2 | 0.2 |
| Example 4 | 0.2 | 0.2 |

All the examples showed good photo profiles in terms of exposure latitude (EL) margin and depth of focus (DoF) margin. From the results in Table 5, it can be confirmed that the introduction of the bis(silyl) monomers in the polymers prepared in Examples 1 to 4 did not adversely affect the photo profile of the patterns.

Experimental Example 6

The patterned specimens obtained in Experimental Example 5 were sequentially dry-etched using $CF_x$ plasma, $O_2$ plasma and $CF_x$ plasma. The remaining organic materials were completely removed using $O_2$, and the cross sections of the etched specimens were observed by FE-SEM. The results are shown in Table 6.

TABLE 6

| Sample used in the formation of film | Shape of pattern after etching |
|---|---|
| Comparative Example 1 | Vertical |
| Example 1 | Vertical |
| Example 2 | Vertical |
| Example 3 | Vertical |
| Example 4 | Vertical |

The shape of the patterns after etching was vertical, indicating good etching characteristics of the specimens. These results reveal that the introduction of the bis(silyl) monomers in the polymers prepared in Examples 1 to 4 did not negatively influence the etch resistance, etch selectivity and etch profile of the masks.

The bis(silyl) monomers used to prepare the polymers in Examples 1 to 4 increase the Si content per repeating units, and increase the number of reactive functional groups, as compared to the alkyltrialkoxysilane monomer used in Comparative Example 1, thus significantly increasing the molecular weights of the polymers during condensation. The films formed using the polymers according to embodiments showed good storage stability and improved etch resistance due to their stable structure.

In addition, it was confirmed that a thin film formed using the hardmask composition with higher proportion of Formula 3 shows a lower contact angle, which means the thin film is more hydrophilic. Accordingly, the hardmask composition may be effective in improving the interfacial compatibility of the thin film with an overlying antireflective coating by controlling hydrophilicity.

As described above, the hardmask composition according to embodiments may have a high silicon content, without using any additional silyl hydride compounds, and may exhibit good storage stability. In addition, the hardmask composition may exhibit excellent film characteristics and allow a pattern to be effectively transferred to a material layer. The hardmask composition may be used to form a hardmask with improved etch resistance against $O_2$ plasma gas upon subsequent etching for patterning. Furthermore, the hardmask composition may be used to form a highly hydrophilic thin film, thus improving the interfacial compatibility of the thin film with an overlying antireflective coating.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A hardmask composition, comprising:
   a solvent;
   an organosilicon copolymer including a UV chromophore group X, the organosilicon copolymer is represented by Formula C:

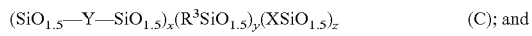
   $(SiO_{1.5}—Y—SiO_{1.5})_x(R^3SiO_{1.5})_y(XSiO_{1.5})_z$     (C); and about 0.0001 parts by weight to about 0.01 parts by weight, based on 100 parts by weight of the organosilicon copolymer, of one or more of pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, or tetrabutylammonium nitrate,
   wherein, in Formula C:
   x, y and z satisfy the following relations:
      x is about 0.05 to about 0.9,
      y is about 0.05 to about 0.9,
      z is greater than 0 and less than about 0.9, and
      x+y+z=1,
   $R^3$ is a $C_1$-$C_{12}$ alkyl group,
   Y is a linking group including:
      a substituted or unsubstituted, linear or branched $C_1$-$C_{20}$ alkyl group,
      a $C_1$-$C_{20}$ group containing a chain that includes an aromatic ring, a heterocyclic ring, a urea group or an isocyanurate group, or
      a $C_2$-$C_{20}$ group containing one or more multiple bonds, and
   X is a $C_6$-$C_{30}$ group containing at least one substituted or unsubstituted aromatic ring.

2. The hardmask composition as claimed in claim 1, wherein the organosilicon copolymer is represented by Formula D:

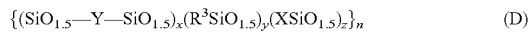
   $\{(SiO_{1.5}—Y—SiO_{1.5})_x(R^3SiO_{1.5})_y(XSiO_{1.5})_z\}_n$     (D)

wherein n is from about 12 to about 2,000.

3. The hardmask composition as claimed in claim 1, wherein the portion $(XSiO_{1.5})$ in Formula C is a derivative of a hydrolysate of a substituted or unsubstituted one of the following compounds, in which R represents a $C_1C_6$ alkyl group;

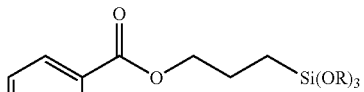

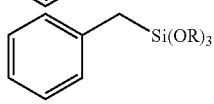

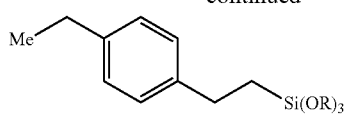

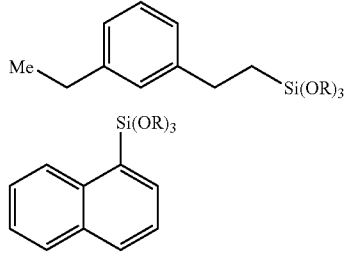

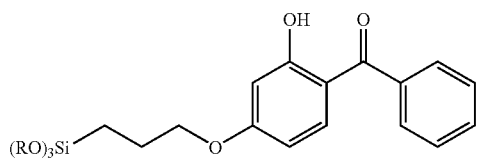

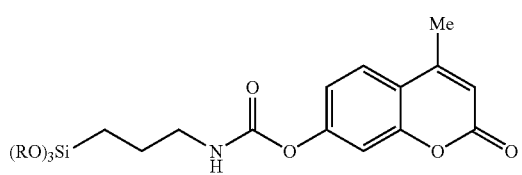

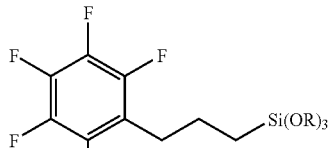

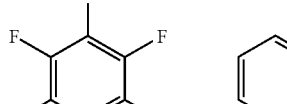

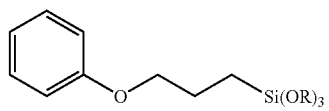

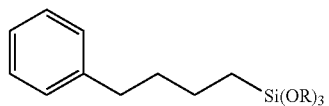

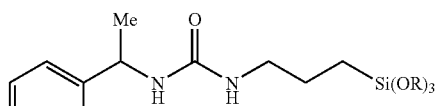

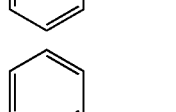

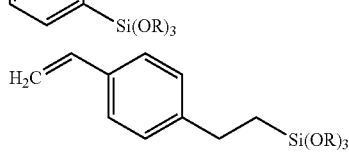

-continued

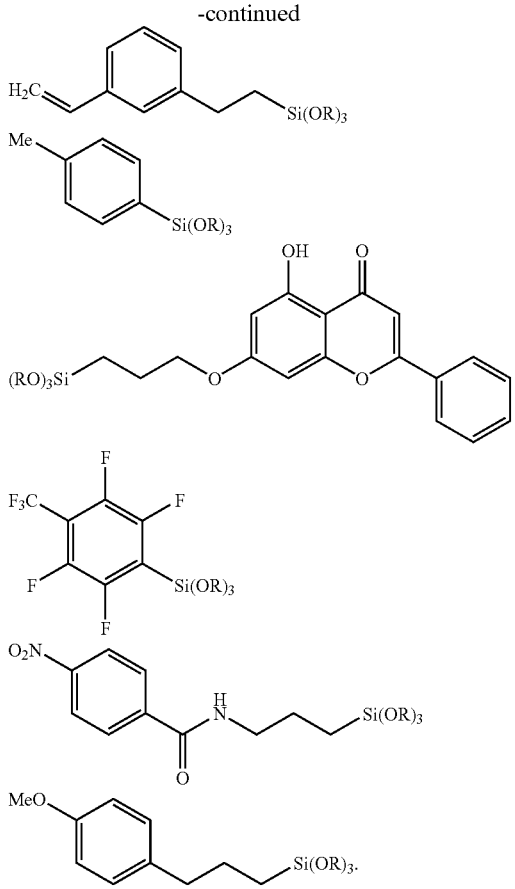

4. The hardmask composition as claimed in claim 1, wherein the composition further comprises one or more of a crosslinker, a radical stabilizer, or a surfactant.

5. A method of producing a device, comprising:
providing a material layer on a substrate;
forming a first hardmask layer of an organic material on the material layer;
coating the hardmask composition as claimed in claim 1 on the first hardmask layer to form a second hardmask layer;
forming a radiation-sensitive imaging layer on the second hardmask layer;
patternwise exposing the imaging layer to radiation to form a pattern of radiation-exposed regions within the imaging layer;
selectively removing portions of the radiation-sensitive imaging layer and the second hardmask layer to expose portions of the first hardmask layer;
selectively removing portions of the first hardmask layer to expose portions of the material layer; and
etching the exposed portions of the material layer to form a pattern in the material layer.

6. The method as claimed in claim 5, further comprising forming an antireflective coating on the second hardmask layer prior to forming the radiation-sensitive imaging layer.

7. A method of forming a hardmask composition having a solvent, an organosilicon copolymer, and one or more crosslinking catalyst, the method comprising:
preparing the organosilicon copolymer by copolymerizing about 5 to about 90 parts by weight of a first monomer represented by Formula 2, about 5 to about 90 parts by weight of a second monomer represented by Formula 3, and greater than 0 parts by weight and less than about 90 parts by weight of a third monomer containing a chromophore group X and represented by Formula 4:

$$[HO]_3Si-R^3 \quad (2)$$

$$[HO]_3Si-Y-Si[OH]_3 \quad (3)$$

$$[HO]_3Si-X \quad (4)$$

wherein the parts by weight of the first, second, and third monomers are based on a combined weight of the first, second and third monomers,
wherein in Formula 2, $R^3$ is a $C_1$-$C_{12}$ alkyl group, and
wherein in Formula 3, Y is a linking group including:
a substituted or unsubstituted, linear or branched $C_1$-$C_{20}$ alkyl group,
a $C_1$-$C_{20}$ group containing a chain that includes an aromatic ring, a heterocyclic ring, a urea group or an isocyanurate group, or
a $C_2$-$C_{20}$ group containing one or more multiple bonds, and
wherein X is a $C_6$-$C_{30}$ group containing at least one substituted or unsubstituted aromatic ring; and
combining the solvent with the organosilicon copolymer and about 0.0001 parts by weight to about 0.01 parts by weight, based on 100 parts by weight of the organosilicon copolymer, of the one or more crosslinking catalyst, wherein the one or more crosslinking catalyst includes pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, tetrabutylammonium formate, tetramethylammonium nitrate, or tetrabutylammonium nitrate.

8. The method as claimed in claim 7, wherein the organosilicon polymer is prepared in the presence of about 100 to about 900 parts by weight of a reaction solvent and about 0.001 to about 5 parts by weight of an acid catalyst, wherein the parts by weight are based on the total weight of the first, the second and the third monomers.

9. The method as claimed in claim 7, wherein preparing the organosilicon copolymer includes hydrolyzing and/or condensing, in the presence of an acid catalyst, a first precursor compound represented by Formula 5, a second precursors compound represented by Formula 6, and a third precursor compound represented by Formula 7:

$$[R^2O]_3Si-R^3 \quad (5)$$

$$[R^4O]_3Si-Y-Si[OR^5]_3 \quad (6)$$

$$[R^1O]_3Si-X \quad (7)$$

wherein, in Formula 5, $R^2$ is a $C_1$-$C_6$ alkyl group and $R^3$ is the same as in Formula 2,
in Formula 6, $R^4$ and $R^5$ are each independently a $C_1$-$C_6$ alkyl group, and Y is the same as in Formula 3,
in Formula 7, $R^1$ is a $C_1$-$C_6$ alkyl group and X is the same as in Formula 4, and
in which the first precursor compound is hydrolyzed and/or condensed into the first monomer and $R^2OH$, the second precursor compound is hydrolyzed and/or condensed into the second monomer and $R^4OH$ and $R^5OH$, and the third precursor compound is hydrolyzed and/or condensed into the third monomer and $R^1OH$.

10. The method as claimed in claim 9, wherein the second precursor compound represented by Formula 6 is a substituted or unsubstituted one of the following compounds, in which R represents a $C_1$-$C_6$ alkyl group:
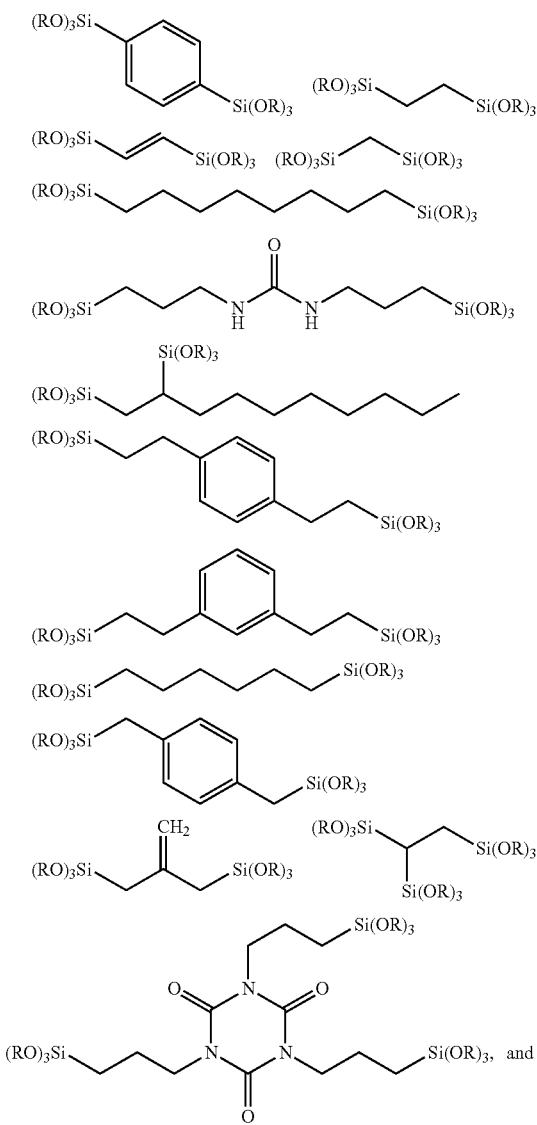
the third precursor compound represented by Formula 7 is a substituted or unsubstituted one of the following compounds, in which R represents a $C_1$-$C_6$ alkyl group:
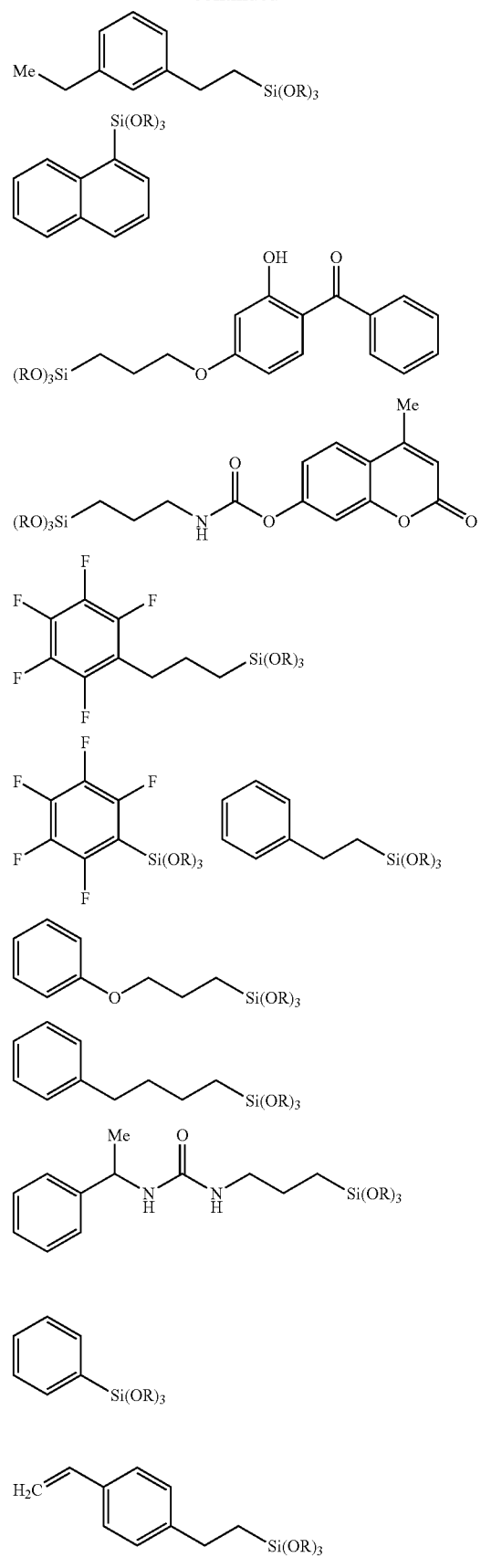

-continued
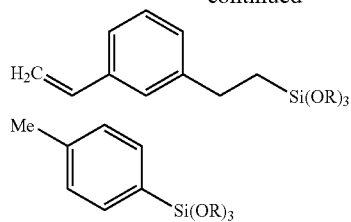
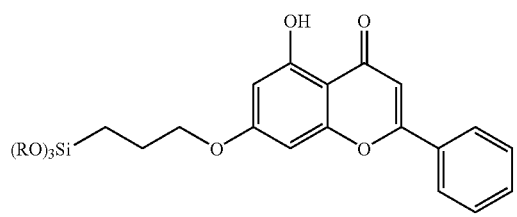
-continued
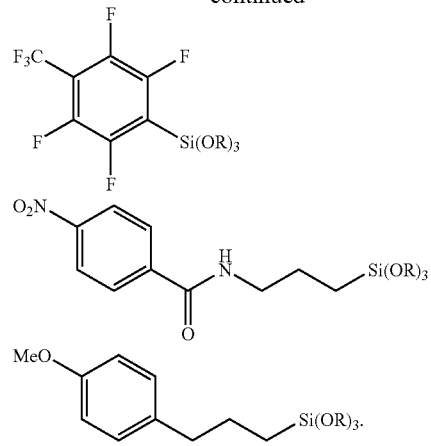
* * * * *